United States Patent [19]

Gschwend

[11] Patent Number: 4,752,027

[45] Date of Patent: Jun. 21, 1988

[54] METHOD AND APPARATUS FOR SOLDER BUMPING OF PRINTED CIRCUIT BOARDS

[75] Inventor: Stephen J. Gschwend, Coeur D'Alene, Id.

[73] Assignee: Hewlett-Packard Company, Palo Alto, Calif.

[21] Appl. No.: 17,112

[22] Filed: Feb. 20, 1987

[51] Int. Cl.⁴ .................................. B23K 31/02
[52] U.S. Cl. .................... 228/180.2; 427/359; 228/207
[58] Field of Search ............. 228/180.2, 207, 243; 427/359, 360, 383.7

[56] References Cited

U.S. PATENT DOCUMENTS

| | | | |
|---|---|---|---|
| 3,621,564 | 11/1971 | Shigezo-Tanaka et al. | 228/180.2 |
| 3,713,575 | 1/1973 | Cushman | 228/180.2 |
| 3,871,015 | 3/1975 | Din et al. | 228/180.2 |
| 4,503,096 | 3/1985 | Specht | 427/359 |
| 4,558,812 | 12/1985 | Bailey et al. | 228/180.1 |
| 4,582,975 | 4/1986 | Daughton | 228/180.2 |
| 4,661,192 | 4/1987 | McShane | 29/827 |

OTHER PUBLICATIONS

IBM Technical Disclosure, vol. 24, No. 12, May 1982.

Primary Examiner—Nicholas P. Godici
Assistant Examiner—Karen Skillman
Attorney, Agent, or Firm—Leslie G. Murray

[57] ABSTRACT

A method and apparatus for preparing printed circuit boards having flattened solder bumps for the mounting of surface mount components is provided. Using well-known techniques, solder paste is screen-printed onto printed circuit boards and reflowed and cleaned to form discrete solder bumps. Using roller machines, the peaks of the solder bumps are flattened and adhesive solder flux is applied to the flattened tops of the solder bumps. The adhesive solder flux holds the surface mount components in position after placement and during vapor phase reflow.

7 Claims, 2 Drawing Sheets

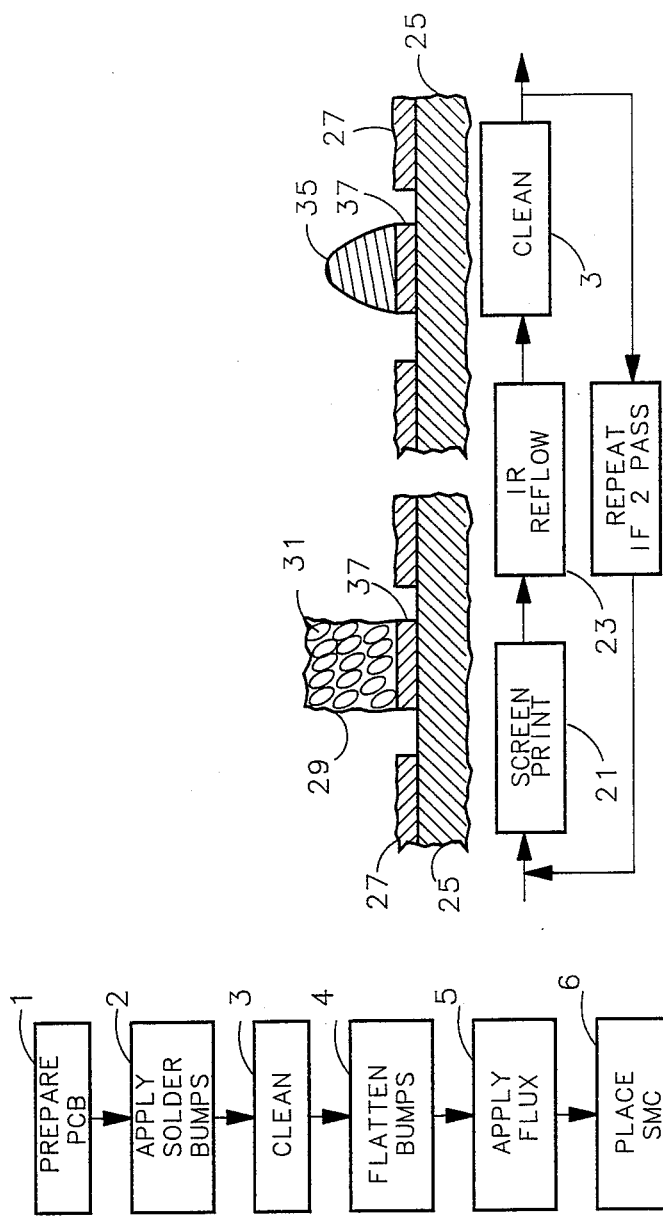

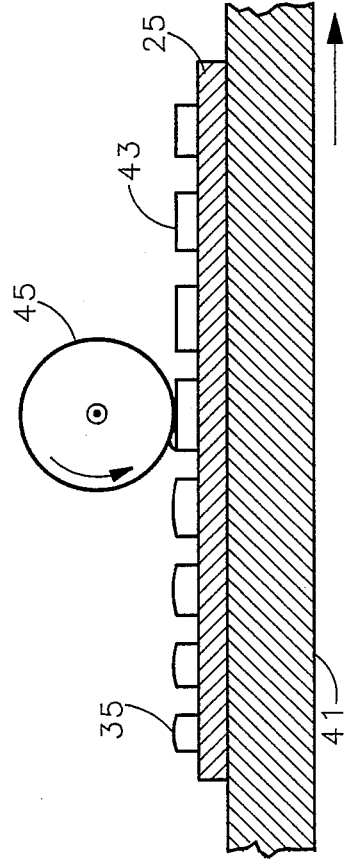
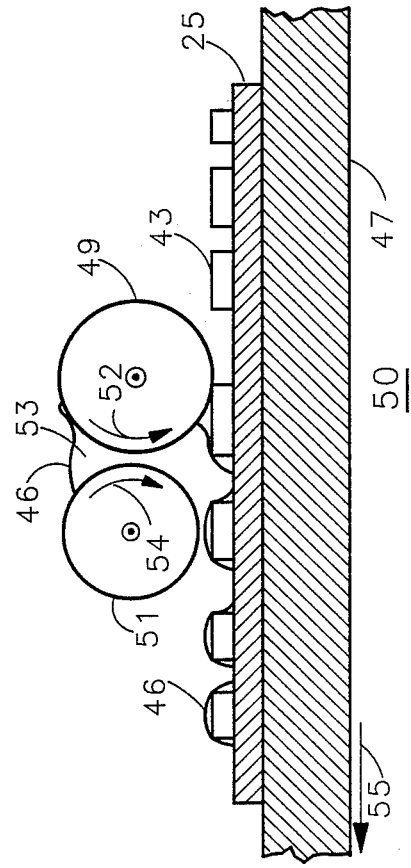

METHOD AND APPARATUS FOR SOLDER BUMPING OF PRINTED CIRCUIT BOARDS

BACKGROUND OF THE INVENTION

The present invention relates generally to the preparation of printed circuit boards for mounting surface mount components and, more particularly to a method and apparatus for mounting surface mount components on printed circuit boards utilizing solder bumps.

The greatly increased use of very large scale integrated circuits, chip resistors, chip capacitors and redesigned inductors and connectors is making surface mounting rather than through-hole mounting of components the technology of choice for printed circuit board (PCB) assembly. Higher packing density of surface mount components (SMC) reduces solder joint size and spacing between components and greatly increases the number of solder joints on each PCB making board inspection more difficult and perfection in soldering imperative. Conventional through-hole component insertion and wave soldering processes are not suitable for the task of surface mounting of components. Further, surface mounting of components places a greater emphasis on the quality of starting materials and process control than is required with conventional wave soldered through-hole components.

Chip carrier or other components are typically surface mounted by soldering component contact pads or leads to corresponding contact pads on a supporting substrate which may be a PCB or the like. Solder must be supplied to the soldering sites in a quality sufficient to wet the contact leads and close all gaps between the component leads and the PCB pads.

It is well-known to screen print solder paste using silk screens or metal foil stencils to apply uniformly thick deposits of solder at predetermined, discrete locations over relatively large circuits such as are found on PCBs. An alternative method of depositing solder paste is multipoint dispensing. In both cases, component leads are immersed in the wet solder paste deposit after which the solder paste is oven cured and then reflowed. A major problem with solder paste is that of solder spatter resulting in small droplets or balls of solder ejected from the paste by gases being evolved from within the paste during rapid solder reflow.

A well-known method which avoids the solder spatter problem is to attach small spherical solder preforms referred to as "solder bumps" to the contact pad areas of the PCB. U.S. Pat. No. 4,558,812 entitled "Method and Apparatus for Batch Solder Bumping of Chip Carriers", issued to Alred S. Bailey et al on Dec. 17, 1985 discloses a technique which makes use of a vacuum plate having a plurality of arrays of dimples, each of the dimples containing a solder preform, to deposit a desired array of solder bumps on a PCB. Another method of forming solder bumps comprises stencil or screen printed or dispensed deposition of solder paste in a desired pattern on a PCB followed by both the oven cure and reflow steps to provide rounded solder bumps prior to placement of the components to be surface mounted. Once the solder bumps are formed, the PCB is cleaned aggressively with solvents and brushing as required to remove any solder spatter deposits. A small quantity of adhesive solder flux is applied to the peaks of the solder bumps by stencil printing or other suitable means before the alignment and placement of the components. The flux holds the SMCs in place during the solder reflow phase.

Although the above-described solder bump process effectively solves the solder spatter problem, maintaining accurate placement of the components is difficult and the reliability of the solder joints is reduced due to misplacement of the component leads. Further, the geometry of the solder bumps makes it difficult and time consuming to apply the flux.

SUMMARY OF THE INVENTION

The present invention provides a method of forming solder bumps on a PCB which overcomes the above-described problems associated with component positioning and flux application. The solder bumps according to the present invention are formed by screen or stencil printing of solder paste and then oven cured and IR reflowed as described herein above to provide a predetermined pattern of convex solder bumps on a PCB. After the bumped PCB has been thoroughly cleaned, the PCB is fed through a roller machine to flatten and level the tops of the solder bumps. The PCB is then fed through a coating machine to apply adhesive solder flux to the flattened solder bump surfaces. The coating machine comprises a pair of rollers set parallel to and adjacent each other. The nip between the two rollers forms a flux reservoir, the thickness of the flux coating applied to the solder bumps being determined by the width of the nip.

The present invention provides a method of forming solder bumps and mounting SMCs on PCBs in which a simple roller flux coating process has replaced a more complex and time consuming screen printing process and, since the SMCs are held on the flat surface of the solder bumps by the flux, the allowable alignment tolerance for placement of the SMCs has been increased to the tolerance for the screen printed solder paste process. Furthermore, use of this process makes possible automated, inline processing of SMCs and the process is well suited to either high or low volume or a high/low mix.

BRIEF DESCRIPTION OF THE DRAWINGS

FIG. 1 is a flow chart diagram illustrating the method for solder bumping of printed circuit boards according to the principles of the present invention;

FIG. 2 is a detailed cross-sectional view of step 2 of the method illustrated in FIG. 1;

FIG. 3 is a cross-sectional view of the solder bump flattening roller; and

FIG. 4 is a cross-sectional view of the flux coating machine.

DETAILED DESCRIPTION OF THE PREFERRED EMBODIMENT

Referring now to FIGS. 1 and 2, a flow chart outlining the PCB processing for forming solder bumps and soldering SMCs to a PCB according to the principles of the present invention is illustrated. As an initial step 1 the PCB is prepared, including cleaning, for the solder deposition process. PCBs with solder mask 27 will most likely be fabricated with additive or semi-additive (thin foil) processes which result in bare copper solder joint areas or contacts 37 exposed through windows in the mask 27. To serve as an inprocess solderability check and as a solderability preservative, a thin coating of solder is applied to the bare copper solder joint areas 37. To accomplish this, a hot air leveling process is used. A PCB is first immersed in molten solder to coat the wettable copper surfaces and then withdrawn from the solder and passed between two high velocity air streams to remove excess solder from the surface and through-holes leaving a thin coating (not shown) of solder on the copper contacts 37.

In step 2 a screen printing process is used to apply uniformly thick deposits of solder paste 29 at discrete locations on a PCB 25. In the screen print step 21, using a silk screen (110 mesh polyester is suitable for this purpose) 0.012 inch thick solder paste deposits 29 are made at each surface mount solder site 37 on PCB 25 (Sn63-PRA-B-3 solder paste manufactured by Kester Solder is suitable for this purpose). Screen printing of the solder paste provides precise volume control to ensure that the optimum amount of solder paste is deposited at each solder site 37. During the IR Reflow phase 23, which may or may not include a paste oven cure phase, the solder granules 31 in the solder paste will melt and flow together to form a solder bump 35 having a rounded shape approximately 0.0065 inch in height. Since the solder paste is about 85 percent solids (solder granules 31) by weight, but only 40-50 percent solids by volume, to obtain a given volume of solder in the solder bump 35 it is necessary to initially deposit about 2.5 times that volume of solder paste 29.

The flux residue after the IR Reflow step 23 contains rosins, resins or related synthetic solids combined with an activator. There may also be solder balls resulting from solder spatter during IR Reflow. The cleaning step comprises vigorous cleaning with solvents followed by distilled or ionized water rinses. Brushing may also be required to remove the spatter deposits. The ease of residue removal is determined in part by the maximum temperature and time of exposure during the IR Reflow step 23. Further, the longer the flux residue remains on the reflowed boards, the more difficult it is to remove. After cleaning the bumped boards are inspected and tested for quality control. The solder bumped boards have a shelf-life of several months and may be used immediatly or stored until required.

Referring now also to FIG. 3, in step 4, the rounded solder bumps 35 are flattened slightly prior to applying solder flux. PCA board 25 is moved under a steel roller 45 on a feed roller or feed table 41 to flatten the solder bumps 35. The height and amount of flattening of the flattened solder bumps 43 is determined by the pressure setting of roller 45, the height setting of roller 45 with respect to feed table 41 and the height and solder volume of solder bumps 35. As required by the particular SMCs to be soldered to the PCA 25 the flattened solder bumps 43 may not be of a uniform size.

Referring now also to FIG. 4, a small amount of adhesive flux 46 is applied to the surface of the flattened solder bumps 43 during the flux application step 5. The flux 46 holds the SMC (not shown) in place on the flattened solder bump 43 during SMC placement and the solder reflow phase 7. The flux application machine 50 comprises feed table 47, a rubber coating or primary roller 49 and a steel secondary roller 51. The coating roller 49 and secondary roller 51 are set parallel to each other and rotate towards each other in the directions shown by arrows 52 and 54, respectively, forming a reservoir of flux 46 in the nip 53 between the rollers 49, 51. A uniform coating of flux 46 is placed on the coating roller 49 by the action of the secondary roller 51 turning against the coating roller 49 at the nip 53. The width of the nip 53 controls the thickness of the flux coating on the coating roller 49 by the amount of compression of the coating roller 49 by the secondary roller 51 (the width of the nip 53 is shown greatly exaggerated for purposes of illustration). A tighter (narrower) nip 53 applies a thinner flux coating on the coating roller 49. The height of the coating roller 49 above the PCA board 25 sets the contact zone to be coated with flux 46. As the height is decreased, the high surfaces of the flattened solder bumps 43 start to coat. On continued decreasing of the height, all of the flattened solder bumps 43 will be coated. The rotation speed of the rollers 49, 51 and the feed speed of the feed table 47 also effect the volume of flux 46 available and the thickness of the flux coating 46 on the flattened solder bumps 43. The direction of feed as indicated by arrow 55 also affects the flux coat 46 deposited on the flattened solder bumps 43. Reverse feed, feeding the PCB 25 through the coating machine 50 in the direction 55 opposite to the direction 52 of rotation of the coating roller 49, will provide a selective flux coating 46 by transferring flux only to the areas which are in contact with the coating roller 49. Forward feed, feeding the PCA board 25 in the same direction as the direction 52 of rotation of coating roller 49, will provide flood coatings (coat the solder bumps not in contact with the coating roller 49 and the areas between the solder bumps 43) and 100 percent transfer of the flux coating on the coating roller 49.

The final two steps, placement of the SMCs 6 and solder reflow 7, are completed used well-known techniques. Placement of the SMCs (not shown) on the PCA board 25 may be done manually or by automated machine or a mixture of both. The solder reflow step 7 consists of oven drying/curing of the flux 46, an IR preheat and a vapor phase reflow to complete the soldering of the SMCs to the PCBs 25.

The major factor in rejection of PCBs using the prior art solder bump processes has been shown to be SMC misalignment on the finished (i.e., soldered) PCB. The adhesive flux 46 holds the SMC in position once the SMC is positioned on the broad 25. However, the flux 46 will not prevent mispositioning of the SMC during placement.

The flux 46 holds the SMC in position until the solder is melted during the vapor phase reflow step 7. During the melting phase, the geometry of the solder bump plays a significnt part in maintaining the proper alignment of the SMC. When the solder melts, the SMC floats on the molten solder and the surface tension tries to pull the liquid solder into a ball; thus, the SMC may be moved into misalignment. As the height of the solder bump is reduced, the tendency of the molten solder to float an SMC is reduced. By flattening the solder bumps, the height is reduced while still maintaining a sufficient volume of solder to wet the SMC contacts and provide a good solder joint. Further, tendency of the flattened solder bump to pull into a ball when molten is reduced. Thus, the SMC misalignment rate using the process of the present invention is greatly improved over that of the prior art solder bump processes.

It is to be understood that the preferred embodiment described herein is merely illustrative of the principles of the present invention. Various modifications may be made thereto by persons skilled in the art which will embody the principles of the invention and fall within the spirit and scope thereof.

I claim:

1. A method of forming coated solder bumps on contact areas of a printed circuit board, said method comprising the steps of:
   forming a plurality of solder bumps in a predetermined pattern on said contact areas of said printed circuit board;
   flattening said plurality of solder bumps to form a plurality of flattened solder bumps, each of said flattened solder bumps having a flat top surface at a predetermined height above the surface of said printed circuit board;
   positioning said printed circuit board on a feed table means;
   feeding said printed circuit board between said feed table means and a pair of rollers, said pair of rollers comprising a primary roller and a secondary roller, said primary roller and said secondary roller disposed in parallel spaced relationship adjacent each other, said primary roller and said secondary roller each having opposite directions of rotation such that said primary roller and secondary roller rotate towards each other and the primary roller rotates opposite to the feeding direction of the circuit board forming a flux reservoir in the nip therebetween, said primary roller being coated with a uniform layer of flux by the compressive action of said secondary roller rotating towards said primary roller, the height above said feed table means of said primary roller being adjusted such that at least some of said plurality of flattened solder bumps are in contact with said primary roller, said flux being transferred to said flattened solder bumps in contact with said primary roller by said contact.

2. A method as in claim 1 wherein the spacing between said primary roller and said secondary roller is adjustable, the thickness of said uniform layer of flux being determined by the width of said spacing.

3. A method as in claim 2 wherein each of said plurality of solder bumps has a predetermined height selected from a plurality of selectable predetermined heights.

4. A method as in claim 3 wherein said step of feeding said printed circuit board between said feed table means and said pair of rollers includes:
   adjusting the height above said feed table means of said primary roller such that selected ones of said flattened solder bumps are in contact with said primary roller as determined by said selected predetermined heights of said flattened solder bumps; and
   feeding said printed circuit board between said feed table means and said pair of rollers in a direction opposite to said direction of rotation of said primary roller coating said selected flattened solder bumps with flux.

5. A method as in claim 3 wherein the step of feeding said printed circuit board between said feed table means and said pair of rollers includes:
   adjusting the height above said feed table means of said primary roller such that said primary roller is at the greatest of said selectable predetermined heights; and
   feeding said printed circuit board between said feed table means and said pair of rollers in the same direction as said direction of rotation of said primary roller thereby coating all of said plurality of flattened solder bumps.

6. Apparatus for applying a coating of adhesive solder flux to a plurality of flattened solder bumps comprising:
   a feed table moveable in a feed direction;
   a primary roller and a secondary roller disposed in parallel relationship adjacent each other in a plane parallel to and above the plane of the feed table; and
   rotating means for rotating said primary roller in a first direction opposite the feed direction and for rotating said secondary roller in a second direction opposite to said first direction such that said primary roller and said secondary roller rotate towards each other forming a flux reservoir in the nip therebetween, said primary roller being coated with a uniform layer of said adhesive solder flux by the compressive action of said secondary roller rotating towards said primary roller.

7. Apparatus as in claim 6 wherein the width of said nip is adjustable controlling the thickness of said uniform layer of adhesive solder flux on id primary roller.

* * * * *